US008009502B2

(12) United States Patent
Johnston et al.

(10) Patent No.: US 8,009,502 B2
(45) Date of Patent: Aug. 30, 2011

(54) SYSTEMS, METHODS AND DEVICES FOR POWER CONTROL IN MASS STORAGE DEVICES

(75) Inventors: Darren Edward Johnston, Burnsville, MN (US); Dean Clark Wilson, Lonsdale, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 65 days.

(21) Appl. No.: 12/632,578

(22) Filed: Dec. 7, 2009

(65) Prior Publication Data
US 2010/0329065 A1 Dec. 30, 2010

Related U.S. Application Data

(60) Provisional application No. 61/220,931, filed on Jun. 26, 2009.

(51) Int. Cl.
*G11C 5/14* (2006.01)
(52) U.S. Cl. ......... 365/229; 365/226; 365/228; 713/300
(58) Field of Classification Search .................. 365/228
See application file for complete search history.

(56) References Cited

U.S. PATENT DOCUMENTS

| | | | |
|---|---|---|---|
| 3,980,935 A * | 9/1976 | Worst ............................ | 365/229 |
| 4,510,400 A | 4/1985 | Kiteley | |
| 5,367,489 A | 11/1994 | Park et al. | |
| 5,438,549 A * | 8/1995 | Levy ............................ | 365/229 |
| 5,459,850 A | 10/1995 | Clay et al. | |
| 5,483,486 A | 1/1996 | Javanifard et al. | |
| 5,497,119 A | 3/1996 | Tedrow et al. | |
| 5,537,360 A | 7/1996 | Jones et al. | |
| 5,546,042 A | 8/1996 | Tedrow et al. | |
| 5,567,993 A | 10/1996 | Jones et al. | |
| 5,592,420 A | 1/1997 | Cernea et al. | |
| 5,717,936 A * | 2/1998 | Uskali ......................... | 713/340 |
| 5,914,542 A | 6/1999 | Weimer et al. | |
| 5,959,926 A | 9/1999 | Jones et al. | |
| 6,091,617 A | 7/2000 | Moran | |
| 6,404,647 B1 | 6/2002 | Minne | |
| 6,567,261 B2 | 5/2003 | Kanouda et al. | |
| 6,700,352 B1 | 3/2004 | Elliott et al. | |
| 6,788,027 B2 | 9/2004 | Malik | |
| 6,838,923 B2 | 1/2005 | Pearson | |
| 6,981,161 B2 | 12/2005 | Koo | |
| 7,019,583 B2 | 3/2006 | Del Signore, II et al. | |
| 7,173,821 B2 | 2/2007 | Coglitore | |

(Continued)

OTHER PUBLICATIONS

N. Li, J. Zhang, and Y. Zhong, "A Novel Charging Control Scheme for Super Capacitor Energy Storage in Photovoltaic Generation System," DRPT2008 Apr. 6-9, 2008 Nanjing China.

(Continued)

*Primary Examiner* — Tan T. Nguyen
(74) *Attorney, Agent, or Firm* — Crawford Maunu PLLC

(57) ABSTRACT

Power-backup capabilities are provided by implementing a variety of different methods, systems and devices. According to one such implementation, an energy storage circuit is powered using a variable voltage controlled to limit the current draw from a power supply, to charge the energy storage circuit for providing backup power to a solid state drive (SSD) type of data storage arrangement. Certain applications involve controlling the power draw from the power supply, in response to feedback and/or power drawn from other circuits, as may be applicable to an initial startup of the energy storage circuit and/or the initial startup of a larger system in which the energy storage circuit is employed.

20 Claims, 3 Drawing Sheets

U.S. PATENT DOCUMENTS

| | | | |
|---|---|---|---|
| 7,177,222 B2 | 2/2007 | Spengler | |
| 7,233,890 B2 | 6/2007 | Shapiro et al. | |
| 7,268,998 B2 | 9/2007 | Ewing et al. | |
| 7,269,755 B2 | 9/2007 | Moshayedi et al. | |
| 7,305,572 B1 | 12/2007 | Burroughs et al. | |
| 7,310,707 B2 | 12/2007 | Olds et al. | |
| 7,318,121 B2 | 1/2008 | Gaertner et al. | |
| 7,321,521 B2 | 1/2008 | Spengler | |
| 7,334,144 B1 | 2/2008 | Schlumberger | |
| 7,360,107 B2 * | 4/2008 | Yuasa | 713/340 |
| 7,404,073 B2 | 7/2008 | Felts | |
| 7,404,131 B2 | 7/2008 | McCarthy et al. | |
| 7,414,335 B2 | 8/2008 | Hussein et al. | |
| 7,487,391 B2 | 2/2009 | Pecone et al. | |
| 2006/0080515 A1 | 4/2006 | Spiers et al. | |
| 2007/0223870 A1 | 9/2007 | Farling et al. | |
| 2008/0007219 A1 | 1/2008 | Williams | |
| 2008/0232144 A1 | 9/2008 | Klein | |
| 2009/0006877 A1 | 1/2009 | Lubbers et al. | |

OTHER PUBLICATIONS

ECNmag.com, "1.2A, 1.6MHz Synchronous Boost Regulator from Linear Technology," Top News, Jan. 8, 2009.

"Get the Lowdown on Ultracapacitors," Penton Media, Inc., Nov. 15, 2007.

STMicroelectronics, "Regulating Pulse Width Modulators, SG3524," Jul. 2000.

Linear Technology, "1.2A Synchronous Step-up DC/DC Converter with Input Current Limit, LTC3125," 2008.

* cited by examiner

SYSTEMS, METHODS AND DEVICES FOR POWER CONTROL IN MASS STORAGE DEVICES

RELATED PATENT DOCUMENTS

This patent document claims the benefit under 35 U.S.C. §119(e) of U.S. Provisional Patent Application No. 61/220,931 filed on Jun. 26, 2009, and which is fully incorporated herein by reference.

FIELD OF THE INVENTION

Aspects of the present invention relate to power monitoring and control features that can be particularly useful for data storage applications in which power draw is an important issue.

BACKGROUND

Electronic data storage devices allow the storage and retrieval of data accessed under the control of electrical signaling. Many different recording mediums exist for storing the data, each having different characteristics and parameters. Memories used in data storage devices can be classified into categories including volatile memories and nonvolatile memories. Nonvolatile memories, e.g., those using magnetic recording mediums or floating-gate transistors, maintain stored data in the absence of electrical power. Volatile memory, such as Dynamic-Random-Access-Memory (DRAM) or Static-Random-Access-Memory (SRAM), loses stored data when electrical power is removed.

Magnetic-based memory devices store data by magnetizing a magnetic recording medium in a particular orientation. Data is read by passing a sensor over the magnetized areas to detect the orientation of the stored magnetic fields. A common format for magnetic recording mediums uses rotating magnetic platters and read-write heads positioned to read or write to the platters as they rotate. Magnetic recording mediums have the advantage of being non-volatile due to the use of a magnetized medium, which does not require electrical power to maintain stored-data integrity.

Solid-state memory refers to memory that uses semiconductor technology as the storage medium. One type of solid-state memory is nonvolatile flash memory. Nonvolatile flash memory operates by storing charge on a floating gate of a memory cell. In particular, nonvolatile flash stores data by charging a floating gate that maintains the stored charge in the absence of electrical power. Flash memory also has the added benefit of not being as susceptible to mechanical perturbations because it does not require movable parts to access (read/write to) the storage medium.

A particular field of use for both solid-state memory and magnetic-based memory relates to storage devices accessible by electronic systems, and more particularly, computer systems. For example, a conventional hard disc drive (HDD) includes a rotating magnetic media that is accessed under the control of electrical signals provided by an electronic control circuit. Another type of data storage device is a solid-state device (SSD) that uses solid-state memory accessed under the control of electrical signals. When viewed from a programming or memory hierarchical perspective, HDDs and SSDs can look similar or even identical. From a practical standpoint, however, these drives often exhibit a number of important differences including, but not limited to, access speeds, power consumption, reliability and susceptibility to data loss due to mechanical vibrations or sudden power loss.

SUMMARY

The present invention is directed to systems and methods for use with power control features of data storage applications in which data integrity is an issue. These and other aspects of the present invention are exemplified in a number of illustrated implementations and applications, some of which are shown in the figures and characterized in the claims section that follows.

Consistent with one embodiment of the present invention, an energy storage circuit for a solid state drive (SSD) type of data storage circuit is charged from a power supply by controlling the power supplied to the energy storage circuit to limit the current drawn thereupon. The power control is effected using current sensed by a feedback circuit, relative to the current drawn by the energy storage circuit or otherwise, and the voltage of the supplied power is accordingly controlled.

In connection with another example embodiment, a power circuit includes an energy storage circuit, a feedback detection circuit and a capacitor charging control circuit that operate to store charge for powering a solid state drive (SSD) data storage circuit in response to a power interruption. The energy storage circuit includes at least one capacitive circuit configured to store charge from the power supply and to provide the stored charge for powering backup functions of the SSD data storage circuit. The feedback detection circuit is configured to detect characteristics of current drawn from the power supply, which may include characteristics of the power drawn by the energy storage circuit during charging. The capacitor charging control circuit is configured to dynamically control the voltage level of power supplied to the energy storage circuit from the power supply, based upon the current draw characteristics detected by the feedback detection circuit, to limit the current load upon the power supply to a threshold current while charging the at least one capacitive circuit.

Various other embodiments are directed to a SSD drive, which can be implemented in one or more of a variety of computer systems using a power supply from the system in which the drive is implemented, with controlled energy storage as discussed above. Still other embodiments are directed to methods relating to the above, combinations of the above circuits and functions, and variations upon the same, as may be relevant to one or more of controlling startup power, and controlling the selective startup of different circuits.

The above summary is not intended to describe each illustrated embodiment or every implementation of the present invention. The figures and detailed description that follow, including that described in the appended claims, more particularly exemplify representative embodiments.

BRIEF DESCRIPTION OF THE DRAWINGS

The invention may be more completely understood in consideration of the detailed description of various embodiments of the invention that follows in connection with the accompanying drawings as follows.

Figure 1:
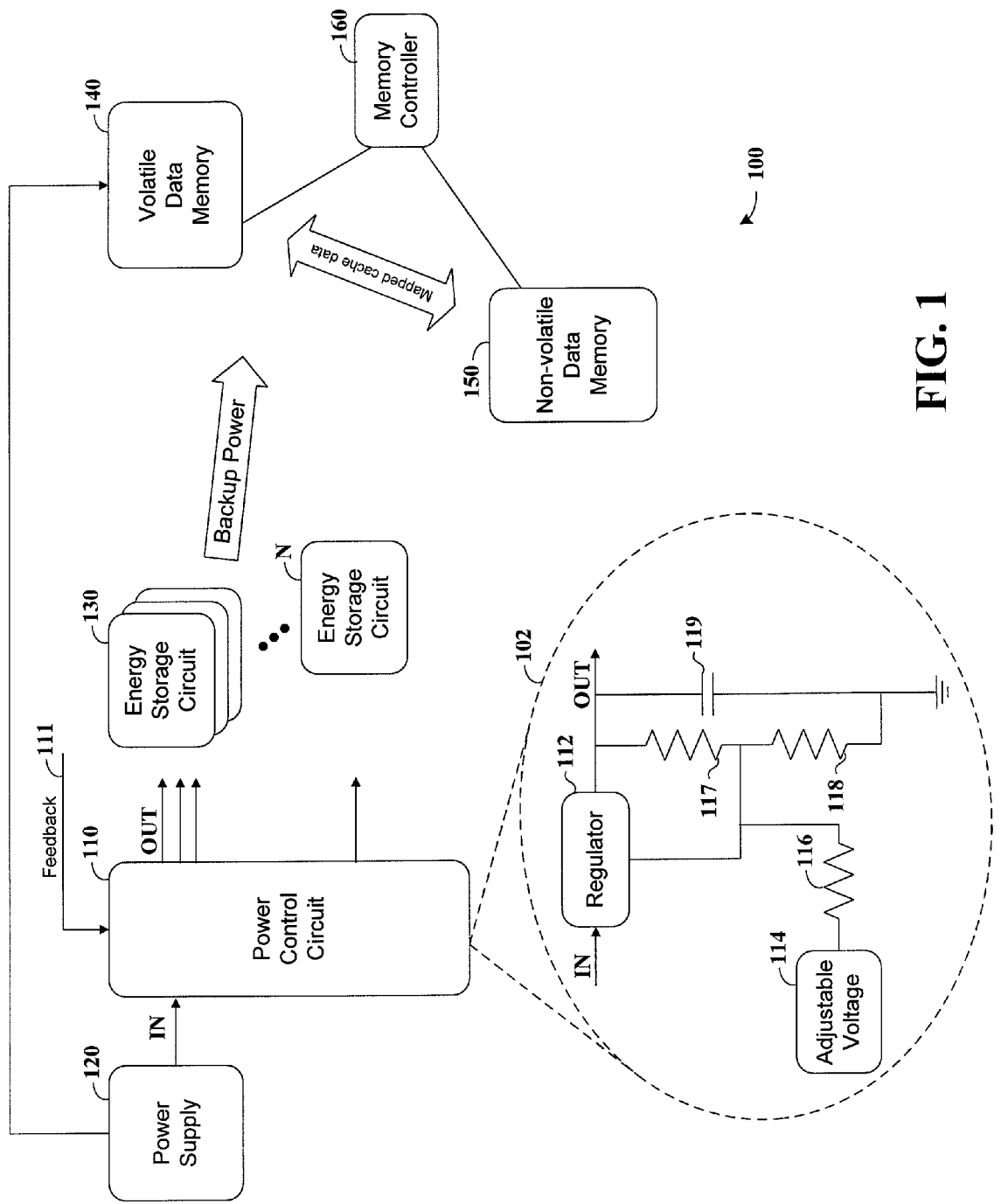
FIG. 1 shows a system for operating power-related functions, including backup power functions, of a data storage device, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present invention are believed to be useful for monitoring and controlling capacitive energy storage circuits, and such circuits as implemented with data storage devices, circuits and systems. A particular application of the present invention relates to solid state devices (SSDs) that provide nonvolatile memory storage functions. While the present invention is not necessarily limited to such applications, various aspects of the invention may be appreciated through a discussion of various examples using this context.

According to an example embodiment of the present invention, power supplied to an energy storage circuit in a startup condition is controlled in response to power usage by the energy storage circuit and/or other circuits, to limit the current drawn by the energy storage circuit. In some instances, this control is effected by variably controlling the voltage of the power supplied to charge the energy storage circuit, to limit the current draw from the power supply. Feedback is used in real-time and/or as a predictive control to control the energy storage circuit charging during startup and, where appropriate, during other conditions and/or to control power supplied to other circuits.

According to another example embodiment of the present invention, the voltage of power supplied to charge an energy storage circuit is dynamically controlled to limit the current drawn by the energy storage circuit. The energy storage circuit is coupled to provide backup power to a SSD data storage circuit, such as in response to a power outage or interruption, and is charged to meet such backup power needs. The dynamic control is effected by monitoring current drawn from the power supply and providing a feedback signal indicative of the current draw. The feedback signal is used to control the voltage of current provided to the energy storage circuit.

In some embodiments, the energy storage circuit includes one or more capacitive circuits respectively configured to store charge from the power supply and to provide the stored charge for powering backup functions of the SSD data storage circuit. The feedback detection circuit detects characteristics of current drawn from the power supply by the one or more capacitive circuits (individually or collectively), and provides a signal based upon the detected characteristics. These characteristics may, for example, include a value indicative of a level of current being drawn, time-based current draw characteristics (e.g., a rate of current draw) over time, and others. A capacitor charging control circuit is configured and arranged to dynamically control the voltage level of power supplied to the energy storage circuit from the power supply, based upon the current draw characteristics of the capacitive circuits as detected by the feedback detection circuit. This dynamic control is effected to limit the current load upon the power supply to a threshold current while charging the at least one capacitive circuit.

In some applications, the feedback detection circuit detects current drawn from the power supply by additional circuits, such as by memory circuits (volatile and non-volatile, as well as any controllers) that draw power from the energy storage circuit under power interruption conditions. By detecting this (total) current draw, the feedback detection circuit provides an overall indication of current drawn from the power supply. The capacitor charging control circuit can use this overall indication of current draw to selectively limit power drawn from each of the respective capacitive circuits in the energy storage circuit, to limit an overall current draw from the power supply.

In certain embodiments, the capacitor charging control circuit is further configured with priority control data that, when executed by the control circuit, is used to control the provision of power to one or more circuits in the SSD data storage circuit. For instance, where two or more energy storage capacitors are employed to provide backup power, one or more of the capacitors may be assigned a higher priority than others of the capacitors, and power is provided to the higher priority capacitor first. In other implementations, priority data is assigned to other circuits in the SSD data storage circuit, and used to control the powering of the other circuits relative to one another and/or the capacitive storage circuits. For instance, one priority data control set is configured to facilitate the charging of capacitors in the energy storage circuit prior to powering other memory circuits, upon a start-up condition, to ensure that backup power is ready in the event of a power interruption or failure during or shortly after startup. In other instances, priority is assigned to one or more memory circuits, which are operated before and/or concurrently with the charging of capacitors in the energy storage circuit. In still other instances, a hybrid approach involves powering (charging) one or more capacitors in the energy storage circuit first, subsequently powering memory circuits and, after bringing up the memory circuits, powering (charging) additional capacitors in the energy storage circuit.

In another example embodiment, a data storage device includes memory circuits that store and retrieve data in response to external control, and a backup power circuit for powering the memory circuits in response to a power interruption. The device includes a non-volatile type solid-state memory circuit that stores data and maintains the integrity of the stored data in the absence of power, and a volatile-type solid-state memory circuit that provides access to a set of data representing a cached portion of memory that is mapped to the non-volatile memory circuit. A memory control circuit controls the caching of memory in the volatile memory circuit, and the writing of cached memory to the non-volatile memory circuit. The backup power circuit includes an energy storage circuit, a feedback detection circuit and a capacitor charging control circuit.

The energy storage circuit includes at least one capacitive circuit that stores charge from a power supply and provides the stored charge for powering backup functions of the non-volatile memory circuit, the volatile memory circuit and the memory control circuit in response to the power interruption. The feedback detection circuit detects characteristics of current drawn from the power supply. The capacitor charging control circuit dynamically controls the voltage level of power supplied to the energy storage circuit from the power supply, based upon the current draw characteristics detected by the feedback detection circuit. This dynamic control is effected (e.g., as described above) to limit the current load upon the power supply to a threshold current while charging the at least one capacitive circuit.

In connection with various example embodiments, the interruption or loss of power is detected using a controller, that in turn operates an energy storage circuit as described herein to control backup functions. The contents of volatile-type memory circuits are then transferred to nonvolatile memory circuits. For further details regarding such approaches as may be implemented in connection with one or more example embodiments, reference can be made to U.S. Pat. No. 7,269,755 to Moshayedi et al., which is fully incorporated herein by reference.

The following discussion of the Figures and the embodiments shown therein represent exemplary implementations of various embodiments, which may be implemented in connection with one or more approaches as described above, in connection with other figures and/or in the claims section that follows. Many different combinations of data storage circuits, power supplies/sources, control circuits and other device/system circuits may be used in accordance with various aspects of the present invention, and may involve one or more of the systems and/or approaches as shown in the figures. In addition, various discussion refers to "memory" and/or "data storage," where one or both terms may refer to similar or the same types of devices and systems, as well understood in the relevant art.

FIG. 1 shows a system 100 for charging and operating a backup power supply to power backup functions of a memory circuit, according to an example embodiment of the present invention. The system 100 includes a power control circuit 110 that is configured to control the current drawn from a power supply 120 by one or more energy storage circuits 130-N, which respectively store and provide backup power. A feedback circuit 111 is coupled across power supply circuits or otherwise to detect current drawn from the power supply 120, as a whole and/or by respective circuits drawing power, including each of the energy storage circuits 130-N. The power control circuit 110 uses the feedback to limit current drawn by one or more of the energy storage circuits 130-N, to limit the overall current drawn from the power supply 120 to a threshold or other limit.

The power control circuit 110 includes one or more of a variety of circuits, depending upon the implementation. Inset 102 shows one such configuration, in which the power control circuit 110 includes a regulator 112 and an adjustable voltage controller 114, respectively implemented with resistors 116, 117 and 118, and with capacitor 119, connected as shown. Power from the power supply 120 is input at the regulator 112, which is controlled using the adjustable voltage controller 114 and the resistors and capacitors as shown, to provide an output for charging one or more of energy storage circuits 130-N (e.g., using a voltage ramp rate as discussed above). The adjustable voltage controller 114 operates in response to feedback received via the feedback circuit 111, to control the voltage of the output from the adjustable voltage controller.

In connection with various example embodiments, the power control circuit 110 controls the powering of circuits using different circuitry and/or control approaches, as an alternative to and/or in addition to that shown in the inset 102. In one embodiment, the power control circuit 110 is configured with a voltage ramp rate that sets or is otherwise used to ramp up the voltage of power supplied to charge the energy storage circuits to limit an initial current inrush. In other embodiments, the power control circuit 110 includes a transistor that is controlled, based upon the feedback at 111, to slow the charging of one of the energy storage circuits 130-N to limit the current load upon the power supply 120 to a level that is below a threshold current. This transistor control is effected in different manners. In one implementation, the power control circuit 110 includes a resistor-capacitor (RC) circuit that controls turn-on of the transistor for slowing the charging of the energy storage circuit 130. In another implementation, the power control circuit 110 includes a pulse width modulation (PWM) circuit that controls turn-on of the transistor for slowing the charging of the energy storage circuit 130.

The energy storage circuits 130-N are connected to provide backup power to data storage circuits including volatile-type memory circuit 140, non-volatile type SSD memory circuit 150 (which maintains data integrity in the absence of electrical power), and a memory controller 160 that controls the memory circuits 140 and 150 as well as access thereto. Each of the energy storage circuits 130-N includes a capacitive storage circuit that stores a charge and uses the stored charge to provide the backup power. Generally, the volatile and non-volatile type memory circuits 140 and 150 store data in response to data accesses, with the volatile-type memory circuit providing access to a set of data representing a cached portion of memory that is mapped to the non-volatile type memory circuit. In response to a power outage, the energy storage circuits 130-N powers backup functions for the memory circuits 140, 150 and 160, such as to write cached data in the volatile-type memory circuit 140 to the non-volatile type memory circuit 150, and/or to perform security functions such as to delete data in the cache. In these examples, the memory controller 160 may be integral to the system 100 (e.g., and control backup memory functions during a power outage), or may be operated separately to provide broader memory control for accesses and caching as described above.

In accordance with the above, the system 100 may include some or all of the respective components as shown in FIG. 1. For instance, some embodiments are directed to a power control circuit 110, configured to operate with a variety of power supplies (120), energy storage circuit(s) (130-N), and SSD data storage devices including one or more types of memory circuits (140, 150 and 160). Other embodiments are directed to a backup power circuit including the power control circuit 110 and energy storage circuits 130-N, which are configured to operate with different power supplies (120) and memory circuits (140, 150 and 160). Still other embodiments are directed to a SSD data storage device, which may be implemented as a stand-alone swappable drive that can be inserted into a variety of systems, and includes the power control circuit 110, energy storage circuits 130-N, and memory circuits 140, 150 and 160, which can operate in a system having one or more power supplies (120) connected to power the SSD data storage device. For swappable drive-type embodiments, the energy storage circuits 130-N may be configured to emulate backup power and/or other power functions relative to a spindle operating in an HDD type of data storage device, which is used by a computer system in which the swappable drive is used (e.g., as a replacement for a HDD). These and other embodiments may be implemented in connection with the various examples described in connection with FIG. 1, as well as those described above, in connection with other figures below, and in the claims.

The system 100 can be operated in a variety of manners, to control the current drawn by one or more energy storage circuits 130-N. In one example, upon startup of the system 100, the power control circuit 110 charges one or more energy storage circuits 130-N to a level that is generally sufficient to provide enough charge to power backup functions of the memory circuits 140, 150 and 160, using the feedback provided at 111 as an indication of current drawn from the energy storage circuits to variably control the voltage of the power provided to the energy storage circuits for charging the same.

Where more than one energy storage circuit is to be charged, the respective charging can be controlled to limit the current drawn, by variable voltage control and/or respectively charging different energy storage circuits at different times and/or in an offset manner.

In some embodiments, the power control circuit 110 controls the powering of the energy storage circuit 130 relative to the other circuits in a manner that limits the current draw upon the power supply 120. Depending upon the number and type of circuits to be powered, and as appropriate, upon programming or other startup algorithm type approaches, the powering of each circuit (and their respective current draws) is offset and variably controlled to meet limits for the power supply 120 and further according to the needs of the system 100. In these contexts, the limits upon the power supply 120 may correspond, for example, to a threshold operating level of the power supply, which may relate to a threshold current or other type of related threshold limit. Using known or otherwise detected power requirements for each type of circuit to be powered, the power control circuit 110 can selectively control the powering of each circuit.

In some embodiments, the power control circuit 110 is configured to store power startup algorithms including respective startup algorithms for starting the capacitive storage circuit 130 and at least one other circuit, and to use the algorithms to control the voltage of power supplied to the capacitive storage circuit 130 and/or otherwise limit current drawn from the power supply 120. In some instances, the algorithms are predefined. In other instances, the power control circuit 110 is programmed to develop the algorithms and/or variables implemented with the algorithms based upon feedback received for a particular application.

In some embodiments, the system 100 includes the power control circuit 110, energy storage circuit 130 and memory circuits 140, 150 and 160, packaged in a removable SSD storage device for implementation with a computer system having the power supply 120 (which is separate from the removable SSD storage device). The power control circuit 110 is programmed to, upon initial startup of the SSD storage device, to monitor power drawn from the power supply 120 and/or otherwise detect characteristics of the power supply. In response to the monitoring and/or detected characteristics, the SSD storage device controls the voltage level of power supplied for charging the energy storage circuit 130 to limit the current drawn from the power supply 120. In this context, the removable SSD storage device is adaptable for implementation with a variety of computer systems and related applications. These adaptable functions may, for example, be programmed as algorithms respectively configured for different predefined operating systems in which the removable SSD storage device may be implemented.

Figure 2:
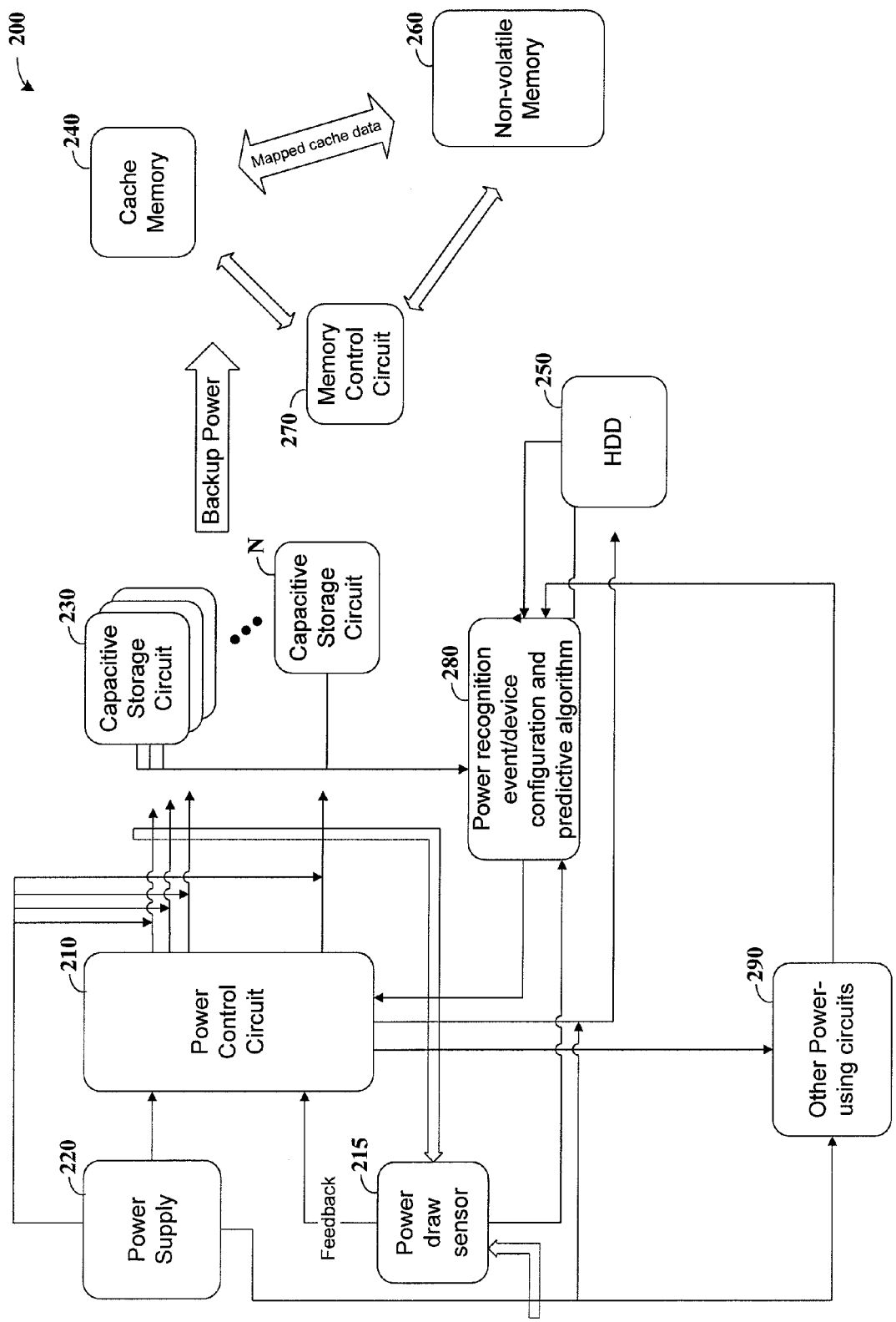
FIG. 2 shows a data storage device and system, according to an example embodiment of the present invention.

FIG. 2 shows a data storage system 200 including SSD-based data storage devices, according to another example embodiment of the present invention. The system 200 includes several SSD-based components and energy storage devices that are similar to those shown in FIG. 1. As such, various aspects of similar devices as described above may be implemented with those shown in FIG. 2, and the following discussion avoids repeating certain aspects of that discussion for brevity.

The system 200 includes a power control circuit 210 that controls the startup power supplied from a power supply 220 to capacitive storage circuits 230-N, which store energy and provide the stored energy to power some or all of memory circuits 240, 260 and 270 and/or additional circuits in the absence of operating power. The power control circuit 210 controls the initial charging of the capacitive storage circuits 230-N upon startup of the system 200, and limits the voltage of the power drawn from the power supply 220 for the initial charging, based upon feedback received from a power draw sensor circuit 215.

The power draw sensor circuit is coupled to sense current drawn across the capacitive storage circuits 230-N, as well as other circuits drawing power from the power supply 220. In this context, the system 200 and related power control provided by the power control circuit 210 can be implemented to control the current draw of the capacitive storage circuits 230-N relative to other circuits, such as hard disk drive (HDD) circuit 250 (which is susceptible to high initial spindle motor power draw), and other circuits 290 as may be used, for example, in a computer system.

As with the above discussion of the system 100 in FIG. 1, the system 200 is applicable for use with SSD-type non-volatile memory 260 to which the cache memory 240 is mapped, and a memory control circuit 270 for controlling memory operations of the cache memory 240 and non-volatile memory 260, which may include backup functions powered by the capacitive storage circuits 230-N. The cache memory 240 may thus be implemented to store data mapped to one or more non-volatile memory circuits such as non-volatile memory circuit 260 and/or to HDD circuit 250.

The power control circuit 210 limits current drawn from the power supply 220 using one or more of a variety of control approaches, such as those described above with FIG. 1 or otherwise. In some implementations, the power control circuit 210 uses sensed current drawn from one of the capacitive storage circuits 230-N to limit the current thereto. In other implementations, the power control circuit 210 uses sensed current drawn by other devices to determine power needs of the system 200, and in response to those needs, controls the current drawn by one or more capacitive storage circuits 230-N. Using these determined power needs, the power control circuit 210 controls the supply of power and/or the respective startup operation of one or more circuits in the system 200 to limit the current drawn from the power supply 220. In other implementations, the power control circuit 210 determines an available current load by subtracting an amount of current being drawn from the power supply 220 from a threshold current load, and limits the current drawn for charging the capacitive storage circuit 230 in response to the available current load.

In another embodiment, the system 200 includes a power recognition circuit 280 that recognizes, detects and/or predicts conditions relative to power events such as startup events or those involving a change in power draw, as well as circuit configurations as may be relative, for example, to detecting a number and type of circuits drawing power from the power supply and their respective power needs. In some implementations, the power recognition circuit 280 is included with the power control circuit 210, and may also be implemented with the power draw sensor 215 as discussed above. These embodiments are amenable, for example, to implementation with a swappable device as discussed above, where the power recognition circuit 280 first recognizes characteristics of the system in which it is employed, and sets current draw characteristics (e.g., a voltage ramp) for charging the capacitive storage circuit(s) 230-N.

In some embodiments, the power recognition circuit 280 detects the number and type of memory circuits, including the number and type of capacitive storage circuits (230) and HDD circuits (250) and uses this information for providing an input to the power control circuit 210 (or provides the information as a direct input), which in turn uses the information to stagger, limit or otherwise control the startup of the different memory circuits. In some implementations, the power recognition circuit 280 further identifies or assigns a priority to each of the respective memory circuits, which is used by the power control circuit 210 to prioritize startup of these circuits. In some implementations, each of the capacitive storage circuits 230-N sends an identification signal to the power recognition circuit 280 to identify itself and/or communicate information that can be used to determine power requirements of the circuit sending the identification signal. Similar approaches may be used to control the startup of other circuits in the system 200.

In accordance with various embodiments, the power recognition circuit 280 detects power events or other conditions for circuits drawing power from the power supply 220, and uses those detected events/conditions in providing input to the power control circuit 210 in different manners. In one implementation, the power recognition circuit 280 monitors functions of circuits drawing power from the power supply 220, and based upon a known or otherwise ascertained function that requires a particular power draw, communicates with the power control circuit 210 to facilitate that power draw. For instance, the power recognition circuit 280 may monitor the progress of the startup of an initial capacitive storage circuit 230, and in response to an event corresponding to the circuit reaching a certain level of charge, may instruct the power control circuit 210 to initiate the current-limited charging of another one of the capacitive storage circuits 230-N and, where appropriate, to further limit the current for charging the initial capacitive storage circuit 230.

In other embodiments, the power recognition circuit 280 predicts future power requirements based upon one or more of known expected operating conditions, learned conditions based upon historical data or real-time operating conditions, for one or more circuits powered by the power supply 220. The power recognition circuit 280 generates a predictive power requirement signal indicative of predicted power requirements and provides that signal to the power control circuit 210 for operating the system 200. The power control circuit 210 uses the power requirement signal to dynamically control the current draw for charging at least one of the capacitive storage circuits 230-N, to limit the current load upon the power supply 220 according to a threshold current. In certain implementations, the power recognition circuit 280 works with the power draw sensor 215 to monitor power draw and predict future power draw, which may further involve storing information characterizing historical power requirements for different circuits.

In these contexts, FIG. 2 shows the system 200 as operable with the power supply 220 coupled through the power control circuit 210, with the power control circuit 210 passing power directly to the respective circuits. FIG. 2 thus also shows that power supply 220 may be coupled directly to the circuits it powers (e.g., using a power rail), including the shown connections to capacitive storage circuits 230-N, HDDs 250 and other power using circuits 290. While not shown, one or both of the power control circuit 210 and the power supply 220 may also be coupled to cache memory circuit 240, non-volatile memory 260 and memory control circuit 270, depending upon the implementation, with respective power supply lines omitted for clarity in the figure.

Figure 3:
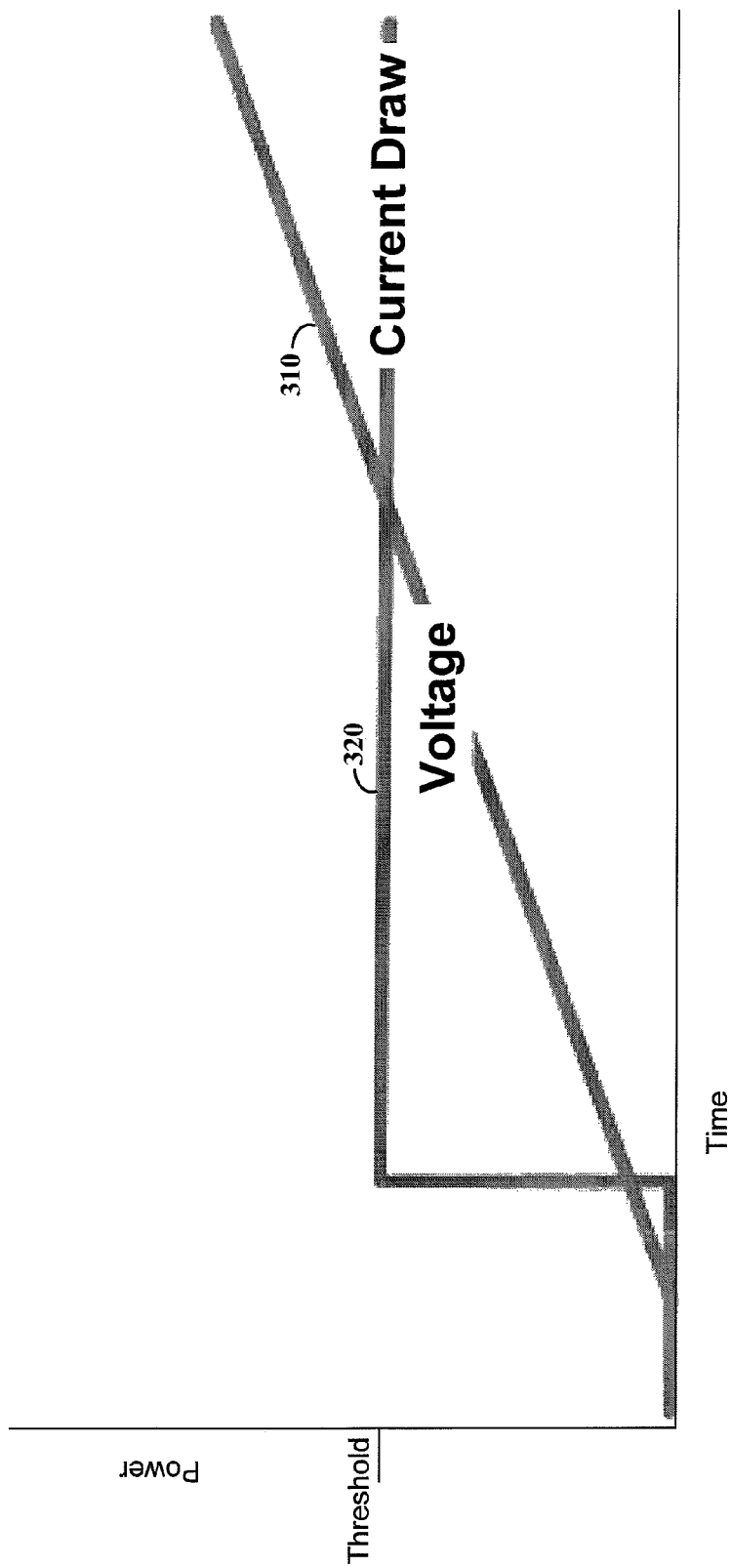
FIG. 3 shows a plot for charging capacitive circuits to store energy for powering (backup) functions of a memory circuit, according to another example embodiment of the present invention.

FIG. 3 shows plots of exemplary voltage-controlled current draw as used for controlling power supplied to an energy storage circuit for an SSD data storage system, as may be implemented with various embodiments including, for example, those shown in FIG. 1, FIG. 2 and described above. Supply voltage 310 versus time is shown for the current-limited powering of energy storage circuits (e.g., capacitive circuits) that store energy for operating backup functions of SSD-based data storage arrangements. The supply voltage 310 sets the current draw 320 of the energy storage circuit as shown, to limit the current draw to a threshold power (on the vertical axis). This threshold is relevant, for example, to a threshold amount of current that can be used to charge an energy storage circuit, and may be less than an overall threshold current for a particular power supply employed for charging the energy storage circuit (e.g., where additional current load is reserved for powering other circuits).

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. For instance, such changes may include combining various sensing, prediction and monitoring circuits, limiting current draw for powering different types of circuits, powering directly with indirect control, powering indirectly with direct control, and others as relevant to the operation of memory circuits and of capacitive storage circuits used for operating backup functions of memory circuits. Such modifications and changes do not depart from the true spirit and scope of the present invention, which is set forth in the following claims.

What is claimed is:

1. A power circuit for powering a solid state drive (SSD) data storage circuit in response to a power interruption, the power circuit comprising:
   an energy storage circuit that includes at least one capacitive circuit configured to store charge from a power supply and to provide the stored charge for powering backup functions of the SSD data storage circuit;
   a feedback detection circuit configured and arranged to detect characteristics of current drawn from the power supply; and
   a capacitor charging control circuit configured and arranged to dynamically control the voltage level of power supplied to the energy storage circuit from the power supply, based upon the current draw characteristics detected by the feedback detection circuit, to limit the current load upon the power supply to a threshold current while charging the at least one capacitive circuit.

2. The circuit of claim 1, wherein the capacitor charging control circuit includes a variable output regulator that is responsive to the output from the feedback detection circuit to control the voltage of the power supplied to the energy storage circuit.

3. The circuit of claim 1, wherein
   the feedback detection circuit is configured and arranged to detect characteristics of current drawn from the power supply by detecting current drawn by the energy storage circuit and by the SSD data storage circuit, and
   the capacitor charging control circuit is configured and arranged to dynamically control the voltage level of power supplied to the energy storage circuit from the power supply based upon the detected current draw characteristics, to limit the current load upon the power supply to a threshold current while charging the at least one capacitive circuit and powering the SSD data storage circuit.

4. The circuit of claim 1, wherein the capacitor charging control circuit includes a voltage regulator configured to increase the voltage of the power supplied to the energy storage circuit over time during a startup condition based upon a voltage ramp rate, to limit the current draw from the power supply below a threshold limit.

5. The circuit of claim 1, wherein the capacitor charging control circuit includes a voltage regulator configured to increase the voltage of the power supplied to the energy storage circuit over time based upon a voltage ramp rate defined according to predetermined power draw characteristics of the energy storage circuit, to limit the current draw from the power supply below a threshold limit.

6. The circuit of claim 1, wherein the capacitor charging control circuit includes a prediction circuit configured to
predict current draw from the power supply based upon the current draw characteristics detected by the feedback circuit, and
use the predicted current draw to control the voltage of the power supplied from the power supply to limit the current drawn from the power supply below a threshold.

7. The circuit of claim 1, wherein
the energy storage circuit includes at least two capacitive circuits,
the feedback detection circuit is configured and arranged to separately detect characteristics of current drawn from the power supply by each capacitive circuit, and
the capacitor charging control circuit is configured and arranged to independently dynamically control the voltage level of power supplied to each of the capacitive circuits, based upon the current draw characteristics detected by the feedback detection circuit.

8. The circuit of claim 1, wherein
the energy storage circuit includes at least two capacitive circuits,
the feedback detection circuit is configured and arranged to separately detect characteristics of current drawn from the power supply by each capacitive circuit, and
the capacitor charging control circuit is configured and arranged to independently dynamically control the voltage level of power supplied to each of the capacitive circuits, based upon the current draw characteristics detected by the feedback detection circuit and priority data assigned to at least one of the capacitive circuits and the SSD data storage circuit.

9. The circuit of claim 1, wherein the capacitor charging control circuit includes a transistor circuit configured to limit the current drawn by the energy storage circuit to a level that is below a threshold current load.

10. The circuit of claim 1, wherein the capacitor charging control circuit includes
a transistor configured to limit the current drawn by the energy storage circuit to a level that is below a threshold current load, and
a transistor control circuit configured to control the transistor for limiting the current drawn by the energy storage circuit, and including at least one of:
a resistor-capacitor (RC) circuit configured to control turn-on of the transistor,
a pulse width modulation (PWM) circuit configured to control turn-on of the transistor, and
a variable voltage controller configured to provide a variable voltage signal to control the turn-on of the transistor.

11. A data storage device that stores and retrieves data in response to external control, the device comprising:
a non-volatile type solid-state memory circuit configured and arranged to store data and to maintain the integrity of the stored data in the absence of power;
a volatile-type solid-state memory circuit configured and arranged to provide access to a set of data representing a cached portion of memory that is mapped to the non-volatile memory circuit;
a memory control circuit to control the caching of memory in the volatile memory circuit, and the writing of cached memory to the non-volatile memory circuit; and
a power circuit for powering the data storage device in response to a power interruption, the power circuit including
an energy storage circuit that includes at least one capacitive circuit configured to store charge from a power supply and to provide the stored charge for powering backup functions of the non-volatile memory circuit, the volatile memory circuit and the memory control circuit in response to the power interruption,
a feedback detection circuit configured and arranged to detect characteristics of current drawn from the power supply, and
a capacitor charging control circuit configured and arranged to dynamically control the voltage level of power supplied to the energy storage circuit from the power supply, based upon the current draw characteristics detected by the feedback detection circuit, to limit the current load upon the power supply to a threshold current while charging the at least one capacitive circuit.

12. The device of claim 11, wherein the capacitor charging control circuit includes a variable output regulator that is responsive to the output from the feedback detection circuit to control the voltage of the power supplied to the energy storage circuit.

13. The device of claim 11, wherein
the feedback detection circuit is configured and arranged to detect characteristics of current drawn from the power supply by detecting current drawn by the memory circuits and the memory control circuits, and
the capacitor charging control circuit is configured and arranged to dynamically control the voltage level of power supplied to the energy storage circuit from the power supply based upon the detected current draw characteristics to limit the current load upon the power supply to a threshold current while charging the at least one capacitive circuit and powering the data storage device.

14. The device of claim 11, wherein the capacitor charging control circuit includes a voltage regulator configured to increase the voltage of the power supplied to the energy storage circuit over time during a startup condition based upon a voltage ramp rate defined according to power draw characteristics of the energy storage circuit, to limit the current draw from the power supply below a threshold limit.

15. The device of claim 11, wherein the capacitor charging control circuit is configured to
store data representing the current draw characteristics detected by the feedback circuit during a startup condition in which the energy storage circuit is charged, and
during another startup condition, use the stored data to predict the current draw from the power supply and control the voltage of the power supplied from the power supply, in response to the predicted current draw, to limit the current drawn to a level that is below a threshold.

16. The device of claim 11, wherein
the energy storage circuit includes at least two capacitive circuits, the feedback detection circuit is configured and arranged to separately detect characteristics of current drawn from the power supply by each capacitive circuit, and the capacitor charging control circuit is configured and arranged to independently dynamically control the voltage level of power supplied to each of the capacitive circuits, based upon the current draw characteristics detected by the feedback detection circuit.

17. The device of claim 11, wherein the energy storage circuit includes at least two capacitive circuits, the feedback detection circuit includes sensor circuits respectively coupled to detect current drawn from the power supply by each capacitive circuit and to generate a current draw signal that characterizes the detected current for each capacitive circuit, and the capacitor charging control circuit is configured and arranged to independently dynamically control the voltage level of power supplied to each of the capacitive circuits, based upon the current draw characteristics detected by the feedback detection circuit and priority data assigned to the capacitive circuits.

18. The device of claim 11, wherein the energy storage circuit includes at least two capacitive circuits, the feedback detection circuit includes sensor circuits respectively coupled to detect current used by the capacitive circuits, the memory circuits and the memory control circuit, and to generate a current draw signal that characterizes the detected current for each of the circuits, and the capacitor charging control circuit is configured and arranged to independently dynamically control the voltage level of power supplied to each of the capacitive circuits, based upon the current draw characteristics detected by the feedback detection circuit and priority data assigned to at least one of the capacitive circuits, the memory circuits and the memory control circuit.

19. The device of claim 11, wherein the capacitor charging control circuit includes a transistor circuit having a transistor and a transistor control circuit configured to control the transistor to limit the current drawn by the energy storage circuit to a level that is below a threshold current load.

20. A method for charging of a backup power circuit to provide backup power for powering a solid state drive (SSD) data storage circuit in response to a power interruption, the method comprising:

coupling power from a power supply to an energy storage circuit that includes at least one capacitive circuit configured to store charge from the power supply and to provide the stored charge for powering backup functions of the SSD data storage circuit;

detecting characteristics of current drawn from the power supply; and dynamically controlling the voltage level of the power coupled to the energy storage circuit from the power supply, based upon the current draw characteristics detected by the feedback detection circuit, to limit the current load upon the power supply to a threshold current while charging the at least one capacitive circuit.

* * * * *